United States Patent [19]
Zerod et al.

[11] Patent Number: 5,739,695
[45] Date of Patent: Apr. 14, 1998

[54] METHOD FOR DYNAMICALLY TESTING RADIO SYSTEMS FOR THE MOTOR VEHICLE ENVIRONMENT

[75] Inventors: Richard David Zerod, Livonia; Richard William Kautz, North Branch, both of Mich.

[73] Assignee: Ford Global Technologies, Inc., Dearborn, Mich.

[21] Appl. No.: 707,771

[22] Filed: Sep. 4, 1996

[51] Int. Cl.$^6$ ........................................... G01R 27/26
[52] U.S. Cl. ...................... 324/637; 324/639; 381/58
[58] Field of Search ........................ 324/637, 639; 381/56, 58

[56] References Cited

U.S. PATENT DOCUMENTS

| | | |
|---|---|---|
| 4,220,915 | 9/1980 | Kawamoto et al. ............ 324/639 |
| 5,177,445 | 1/1993 | Cross ............................ 324/637 |

OTHER PUBLICATIONS

Minoru Take, Field Simulation Method For Automotive Radio Evaluation, pp. 1–5, Dec. 13, 1995.

*Primary Examiner*—Maura K. Regan
*Attorney, Agent, or Firm*—Mark L. Mollon, Esq.; Roger L. May, Esq.

[57] ABSTRACT

A method is disclosed for dynamically testing a radio system having output terminals connectable to a speaker system in a motor vehicle wherein the method utilizes a dynamometer, a transverse electromagnetic cell, a signal generator and a signal analyzer and includes the steps of placing the motor vehicle in the transverse electromagnetic cell, connecting the output terminals to the signal analyzer, operating the motor vehicle on the dynamometer inside the transverse electromagnetic cell, generating a signal using the signal generator, transmitting the signal from the signal generator to the transverse electromagnetic cell, emitting the signal onto the motor vehicle, and measuring an output signal generated by the radio system at the output terminals using the signal analyzer.

13 Claims, 4 Drawing Sheets

METHOD FOR DYNAMICALLY TESTING RADIO SYSTEMS FOR THE MOTOR VEHICLE ENVIRONMENT

BACKGROUND OF THE INVENTION

1. Field of the invention

The invention relates to a method for testing radio systems in motor vehicles. More particularly, the invention relates to a method for dynamically testing radio systems in motor vehicles in a manner which is objective and repeatable under varying synthesized environmental conditions.

2. Description of the Related Art

Radio systems found in the motor vehicle environment are exposed to ever changing electromagnetic fields due to their mobility. It becomes difficult for designers of radio systems to accurately determine how a particular system will perform, given the volatile environment in which the radio systems are to perform. Attempts have been made to test radio systems in various conditions. The radio system inside the motor vehicle must operate in locations which may be remote from each other under conditions which may be difficult to repeat. These tests are costly and too subjective to make any reliance thereupon.

In Field Simulation Method For Automotive Radio Evaluation, Minoru Take, Alpine Electronics, Incorporated, a system for testing radio components found in a motor vehicle environment is disclosed. This method places each individual radio component in a transverse electromagnetic cell (TEM cell) wherein each component is tested separately to determine its output characteristics based on electromagnetic fields which are emitted by the TEM cell and directly toward the component in the interior thereof. Although the system disclosed is one which provides test results from tests which may be repeated, this system is not capable of combining all of the radio components into an operating system in an environment in which the system will operate. Therefore, the test results from the system disclosed will never be an accurate representation of how a radio system, composed of several radio components, will operate in a motor vehicle environment.

SUMMARY OF THE INVENTION

Accordingly, a method for dynamically testing a radio system having output terminals connectable to a speaker system in a motor vehicle is disclosed. The method utilizes a dynamometer, a transverse electromagnetic cell, a signal generator and a signal analyzer. The method includes the steps of placing the motor vehicle in the transverse electromagnetic cell. Output terminals of the radio system are connected to the signal analyzer. The motor vehicle is then operated on the dynamometer inside the transverse electromagnetic cell. A signal generator generates a signal which is transmitted therefrom to the transverse electromagnetic cell. The signal is then emitted onto the motor vehicle. An output signal is generated by the radio system and output through the output terminals at which point it is measured using the signal analyzer.

One advantage associated with the invention is the ability to test a radio system designed to be used in a motor vehicle. Another advantage associated with the invention is the ability to dynamically test a radio system designed to be used in a motor vehicle. Yet another advantage associated with the invention is the ability to dynamically test a radio system designed to be used in a motor vehicle wherein the testing is accurately repeatable. Still another advantage associated with the invention is the ability to dynamically test a radio system designed to be used in a motor vehicle in a cost efficient manner.

Other features and advantages of the present invention will be readily appreciated as the same becomes better understood after reading the subsequent description taken in conjunction with the accompanying drawings.

DESCRIPTION OF THE PREFERRED EMBODIMENT(S)

Figure 1:
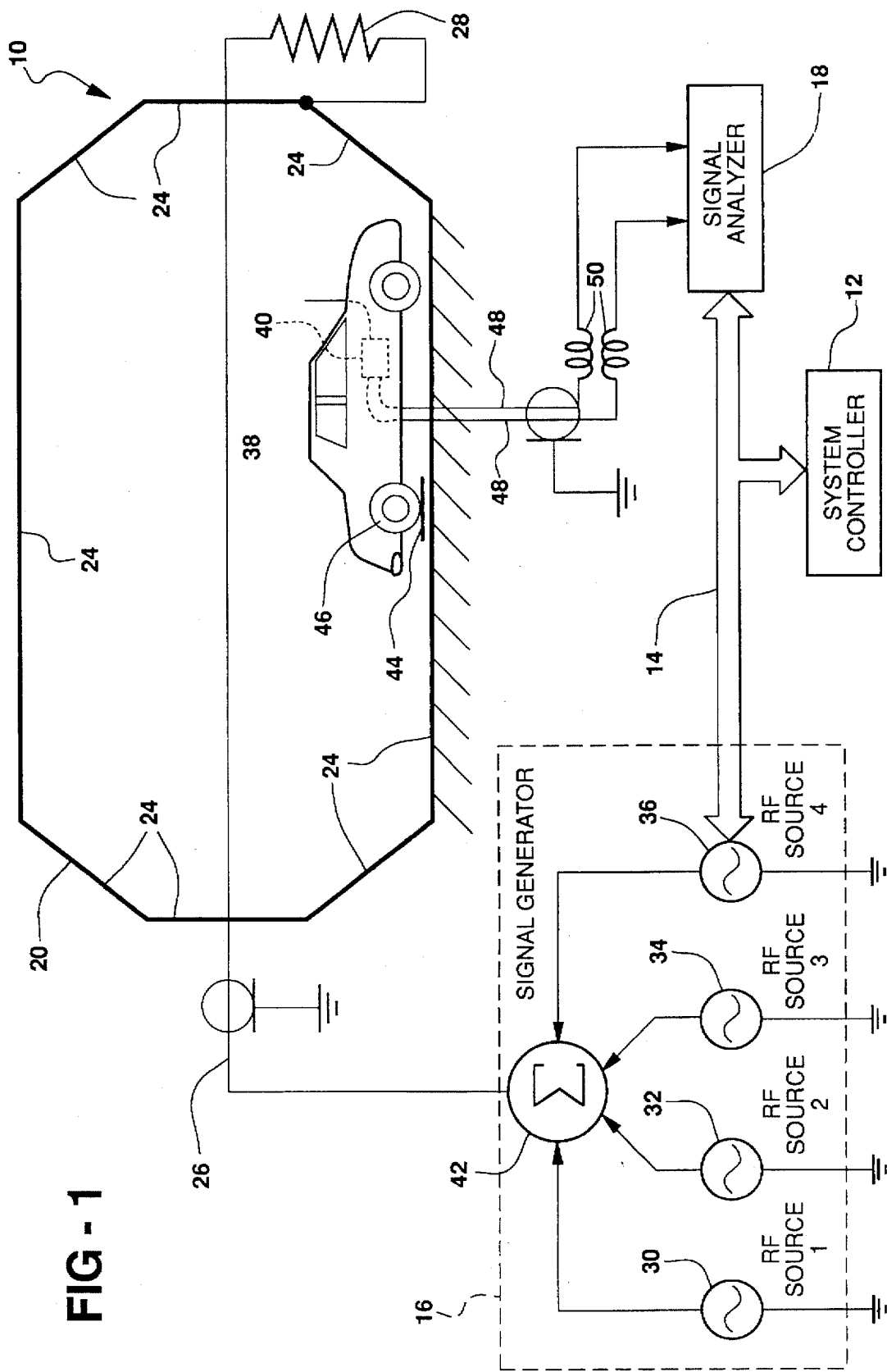
FIG. 1 is schematic view of one embodiment of a system designed to operate the method of the invention.

Referring to FIG. 1, the testing facility to perform the method of the invention is generally indicated at 10. The testing facility 10 includes a system controller 12 which is in communication, through a communications bus with a signal generator 16 and a signal analyzer 18. The output of the signal generator 16 is connected to a TEM cell 20 having an interior 22 and shielded interior walls 24. The output of the signal generator 16 is sent through a septum 26 which, together with shield walls 24, constrains and establishes the properties of an electromagnetic field in the area in which the motor vehicle 38 will be placed. A load resistor 28 is connected along the conductor 26. In one embodiment, the load resistor 28 is fifty Ohms.

The signal generator 16 includes a plurality of radio frequency (RF) sources 30,32,34,36. The RF sources 30 through 36 generate signals of varying frequencies and amplitudes. The signals generated by these RF sources 30 through 36 may be generated using a function or group of functions. Alternatively, the RF sources 30 through 36 may generate signals previously recorded. The previous recordings may be taken in specific locations having characteristic electromagnetic fields through which a motor vehicle 38 may be exposed. It is preferred that the RF sources 30 through 36 are recordings of field measurements so that the output of a radio system 40 installed in the motor vehicle 30 may be more accurately determined based on environments in which the radio system 40 will be found. An adder 42 receives the signals generated by the RF sources 30 through 36 and combines them into a single signal which is to be transmitted through the conductor 26, the output of the signal generator 16. The adder 42 simulates the true environment because all the electromagnetic signals impinge the radio system 40 at the same time.

A dynamometer 44 is graphically represented by a pad upon which driven wheels 46 of the motor vehicle 38 turn. The dynamometer 44 allows the motor vehicle 38 to operate similar to how the motor vehicle 38 would operate in the environments in which the electromagnetic fields recorded by the RF sources 30 through 36 would be found. The dynamometer 44 allows testing of the motor vehicle 38 in a manner more representative of how the radio system 40 will perform. The radio system 40 includes output terminals 48 which are connected to speakers used to transform the electrical signals generated by the radio system 40 into mechanical waves which are audible. During the testing method, however, the output terminals 48 are connected to the signal analyzer 18 through a common mode RF choke 50. The signal analyzer 18 can analyze the signals generated by the radio system 40 and transmitted to the output terminals 48. More specifically, the signal analyzer 18 is capable of analyzing the radio system 40 as it functions as a system in an environment similar to that which the radio system 40 may eventually operate, i.e., in a running motor vehicle 38 with electromagnetic fields inpinging thereupon.

Figure 2:
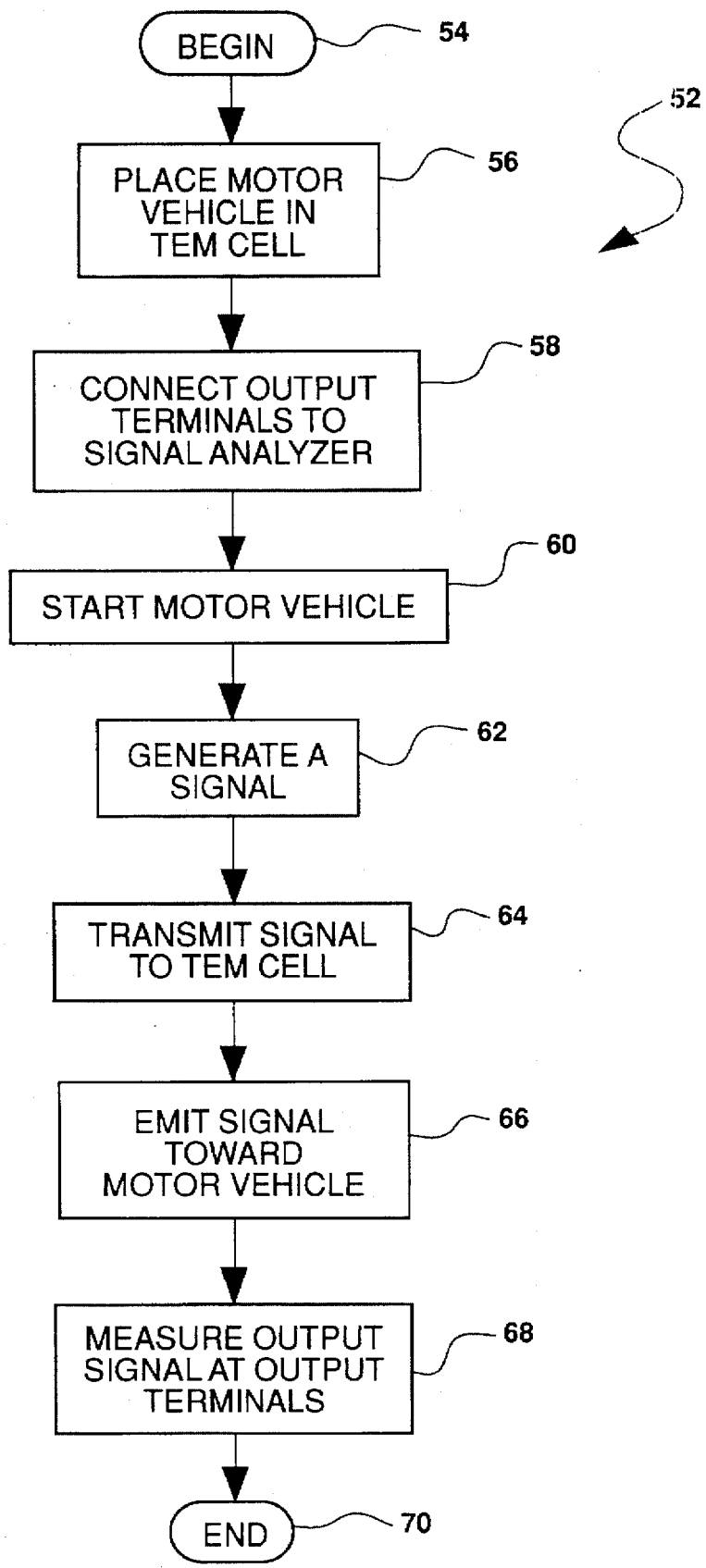
FIG. 2 is a flow chart of the method for testing radio systems according to the invention.

Referring to FIG. 2, one embodiment of the method for dynamically testing the radio system 40 is graphically represented at 52. The method begins at 54. A motor vehicle is placed in the TEM cell 20 at 56. The output terminals 48 are connected to the signal analyzer 18 at 58. The motor vehicle 38 is started and operated at 60. A signal is generated from the signal generator 16 at 62. This signal is transmitted to the TEM cell 20 at 64. The signal is emitted toward the motor vehicle 38 through the conductor 26 at 66. The output signal is then measured at the output terminals 48 at 68. Once the test is completed the method terminates at 70.

The signal generated at 62 includes a plurality of frequencies, each generated by an RF source 30 through 36. Each of these RF sources 30 through 36 generates a sub-signal which, when added by the adder 42, generates the single signal which is propagated through the conductor 26.

The testing procedure 52 may be validated by operating the motor vehicle 38 in the environment wherein the sub-signals were recorded. This includes driving the motor vehicle 38 outside the TEM cell 20 to locations which generate the sub-signals. Once the motor vehicle 38 is tested by the signals which were recorded and subsequently generated through the RF sources 30 through 36, a meaningful validation or correlation can be made.

Figure 3:
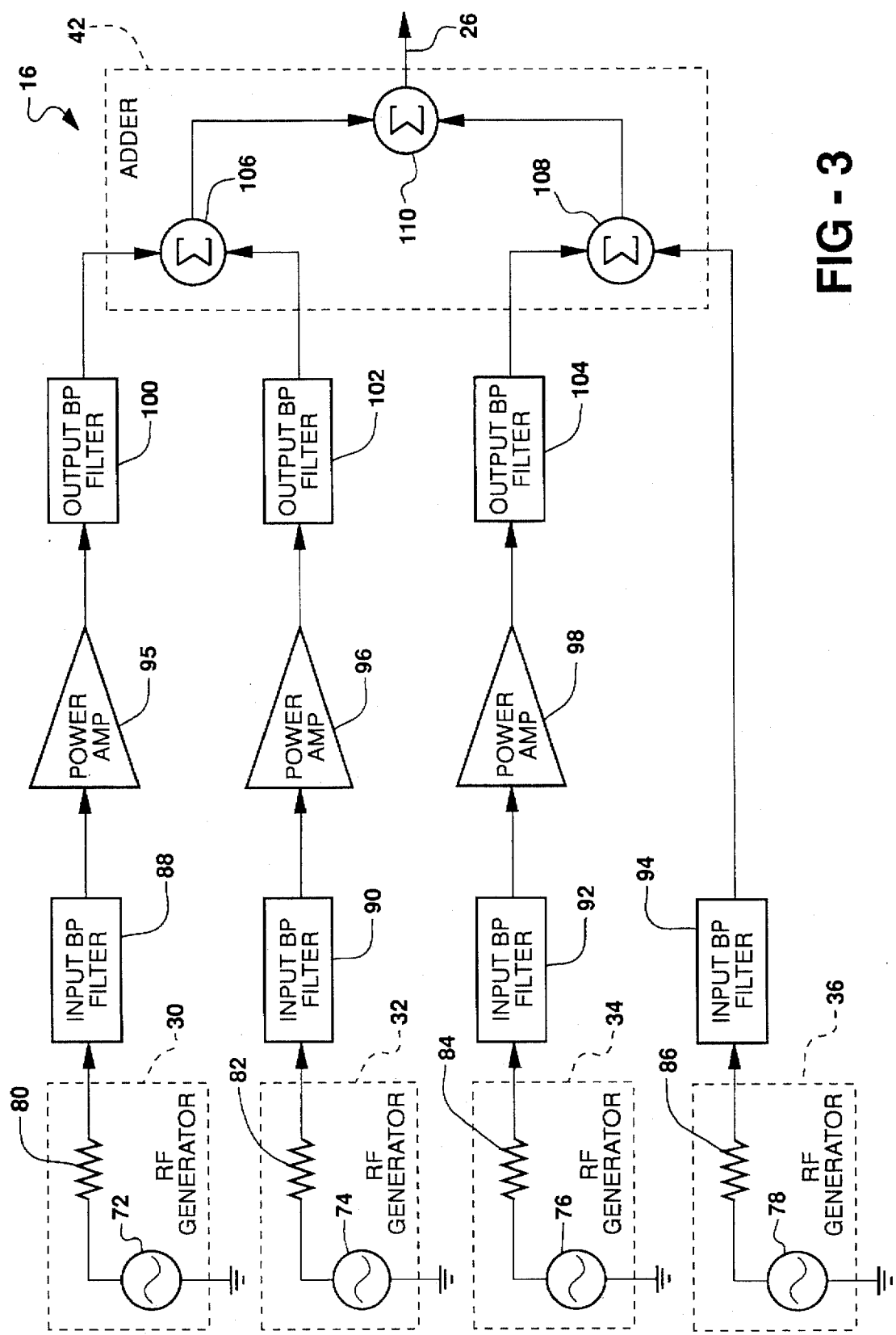
FIG. 3 is a block diagram of one embodiment of a multi-signal system used by the embodiment of FIG. 1 to perform the method of the invention.

Referring to FIG. 3, the signal generator 16 is generally indicated. The RF sources 30 through 36 each include a signal generator 72,74,76, and 78. The output impedance of each signal generator 72,74,76,78 is represented by an equivalent series resistor 80,82,84,86, respectively. Each sub-signal generated by the RF sources 30 through 36 is sent through a band pass filter 88,90,92,94. As may be seen when referring to RF sources 30 through 34, a power amplifier 94,96,98 amplifies the sub-signal after it is filtered through the band pass filters 88,90,92. The fourth RF source 36 does not include a power amplifier as a representation of signals which are strong enough not to require amplification. The output of each of the power amplifiers 94,96,98 is sent through output band pass filters 100,102,104. The sub-signals generated by the RF sources 30,32 are added by the adder 42. The combiner 42 includes two stages. The first stage includes an adder 106 and a second adder 108, the outputs of which are added at the second stage adder 110. The output of the second stage adder 110 is sent to the TEM cell 20.

Figure 4:
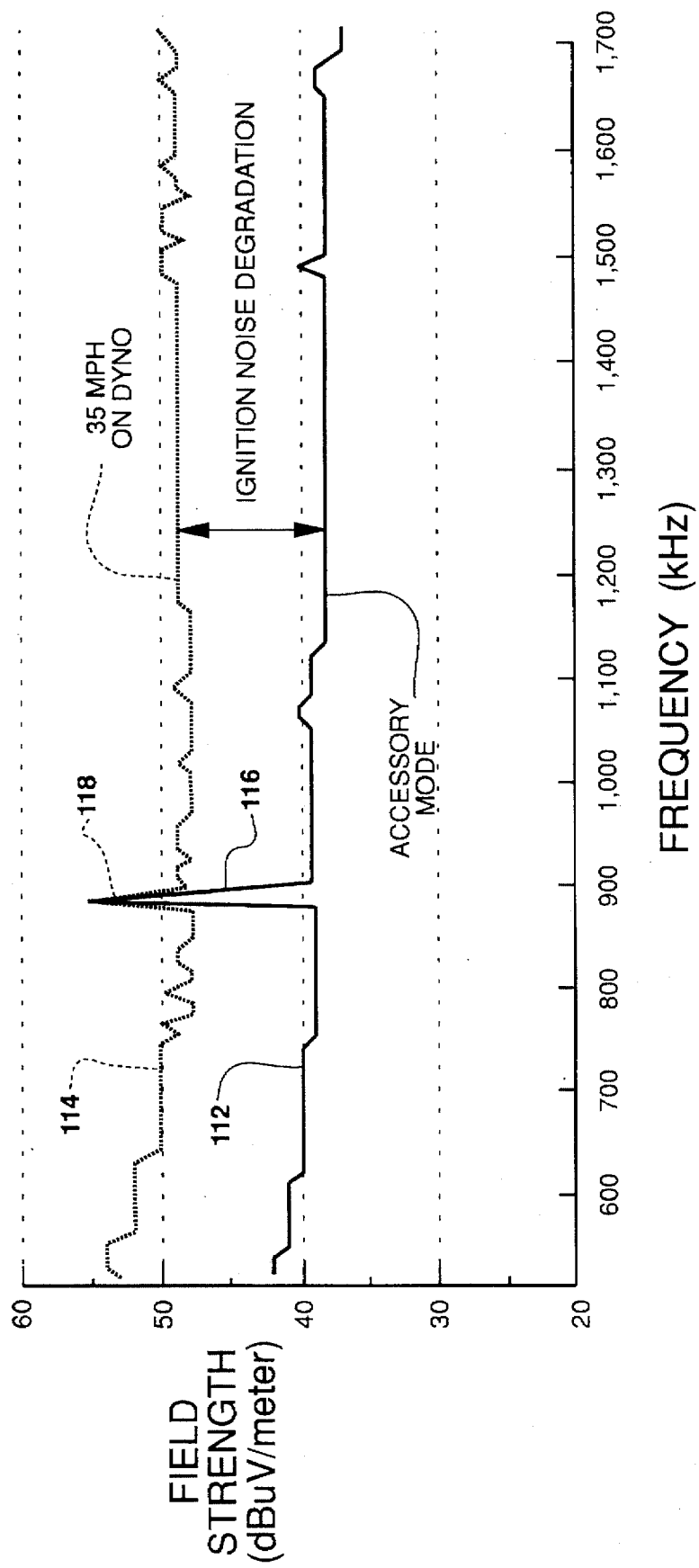
FIG. 4 is a graphic representation of the output signal of a radio system tested using the method of the invention.

Referring to FIG. 4, a graphic representation of the electromagnetic field incident on the motor vehicle 38 necessary to produce a constant desired output signal characterization at the output terminals 48 of the radio system 40 is shown in two different conditions. The first condition is denoted by a solid line 112. In a second condition, the output signal is represented by a dash line 114. The first condition represented by a straight line 112 is when the motor vehicle 38 is in the accessory mode. More specifically, the motor vehicle 38 is powering the radio system 40 by an electrical power source, typically a battery (not shown). In the second mode, the motor vehicle 38 is operating at 35 miles per hour on the dynamometer 44. The noise degradation between the two conditions is shown by the different electromagnetic field strengths required to produce the same constant desired output signal characterization. Once the data is generated, the radio system 40 may be improved to remove spikes such as spike 116,118 which is a second harmonic.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A method for dynamically testing a radio system having output terminals connectable to a speaker system in a motor vehicle using a dynamometer, a transverse electromagnetic cell, a signal generator and a signal analyzer, the method comprising the steps of:

placing the motor vehicle in the transverse electromagnetic cell;

connecting the output terminals to the signal analyzer;

operating the motor vehicle on the dynamometer inside the transverse electromagnetic cell;

generating a signal using the signal generator;

transmitting the signal from the signal generator to the transverse electromagnetic cell;

emitting the signal onto the motor vehicle; and measuring an output signal generated by the radio system at the output terminals using the signal analyzer.

2. A method as set forth in claim 1 wherein the signal generated by the signal generator includes a plurality of frequencies.

3. A method as set forth in claim 1 including the step of combining a plurality of sub-signals to generate the signal.

4. A method as set forth in claim 3 including the step of creating each of the plurality of sub-signals from one of a plurality of sub-signal generators.

5. A method as set forth in claim 4 including the step of adding each of the plurality of sub-signals to generate the signal.

6. A method as set forth in claim 5 including the step of recording each of the plurality of sub-signals from each source outside the transverse electromagnetic cell.

7. A method as set forth in claim 6 including the step of validating the output signal.

8. A method as set forth in claim 7 wherein the step of validating includes the step of driving the motor vehicle outside of the transverse electromagnetic cell.

9. A method for dynamically testing a radio system having output terminals in a motor vehicle using a dynamometer, a transverse electromagnetic cell, a signal generator and a signal analyzer, the method comprising the steps of:

placing the motor vehicle in the transverse electromagnetic cell;

connecting the output terminals to the signal analyzer;

recording sub-signals generated outside the transverse electromagnetic cells;

adding the sub-signals to generate a signal;

operating the motor vehicle on the dynamometer inside the transverse electromagnetic cell;

transmitting the signal from the signal generator to transverse electromagnetic cell;

emitting the signal onto the motor vehicle inside the transverse electromagnetic cell; and measuring an output signal generated by the radio system at the output signals terminal using the signal analyzer.

10. A method as forth in claim 9 including the step of validating the output signal.

11. A method as set forth in claim 10 wherein the step of validating includes the step of driving the motor vehicle outside the transverse electromagnetic cell.

12. A method for dynamically testing a radio system having output terminals connectable to a speaker system in a motor vehicle using a dynamometer, a transverse electromagnetic cell, a signal generator and a signal analyzer, the method comprising the steps of:

placing the motor vehicle in the transverse electromagnetic cell;

connecting the output terminals to the signal analyzer;

operating the motor vehicle on the dynamometer inside the transverse electromagnetic cell;

generating a signal using the signal generator;

transmitting the signal from the signal generator to the transverse electromagnetic cell;

emitting the signal onto the motor vehicle;

measuring an output signal generated by the radio system at the output terminal using the signal analyzer; and validating the output signal.

13. A method as set forth in claim 12 wherein the step of validating includes the step of driving the motor vehicle outside the transverse electromagnetic cell.

* * * * *